United States Patent [19]

Trogdon

[11] 4,140,945
[45] Feb. 20, 1979

[54] SUSTAINER WAVE FORM HAVING ENHANCEMENT PULSE FOR INCREASED BRIGHTNESS IN A GAS DISCHARGE DEVICE

[75] Inventor: Ray L. Trogdon, Perrysburg, Ohio

[73] Assignee: Owens-Illinois, Inc., Toledo, Ohio

[21] Appl. No.: 867,399

[22] Filed: Jan. 6, 1978

[51] Int. Cl.² ............... H05B 37/00; H05B 39/00; H05B 41/00

[52] U.S. Cl. .................. 340/776; 340/805; 315/169.4

[58] Field of Search ............. 315/169 R, 169 TV; 340/324 M

[56] References Cited

U.S. PATENT DOCUMENTS 3,919,591  11/1975  Criscimagna ............. 315/169 TV

Primary Examiner—Craig E. Church
Assistant Examiner—Robert E. Wise

Attorney, Agent, or Firm—M. E. Click; D. H. Wilson

[57] ABSTRACT

A gas discharge device, including an interface and addressing means connected to a pair of opposed electrode arrays to energize a plurality of discharge cells, each cell including proximate electrode portions of at least one electrode in each opposed array, the dielectric charge storage member insulating at least one of the proximate electrode portions from the gas. A sustainer voltage source generates an alternating polarity wave form which maintains a discharge sequence in all cells which are in the "on" state. In accordance with the present invention, an enhancement pulser means generates an enhancement voltage pulse which is cyclically superimposed on the sustainer wave form. The enhancement pulse has the same polarity as the sustainer wave form and is generated to coincide with each discharge of the cells in the "on" state to increase the brightness and performance of the gas discharge device.

6 Claims, 3 Drawing Figures

SUSTAINER WAVE FORM HAVING ENHANCEMENT PULSE FOR INCREASED BRIGHTNESS IN A GAS DISCHARGE DEVICE

BACKGROUND OF THE INVENTION

1. Field of the Invention

This invention relates to circuits for controlling gas discharge devices, especially multiple gas discharge display/memory devices which have an electrical memory and which are capable of producing a visual display or representation of data.

2. Description of the Prior Art

Heretofore, multiple gas discharge display and/or memory panels have been proposed in the form of a pair of dielectric charge storage members which are backed by electrodes, the electrodes being so formed and oriented with respect to an ionizable gaseous medium as to define a plurality of discrete gas discharge units or cells. The cells have been defined by a surrounding or confining physical structure such as the walls of apertures in a perforated glass plate sandwiched between glass surfaces and they have been defined in an open space between glass or other dielectric backed with conductive electrode surfaces by appropriate choices of the gaseous medium, its pressure and the electrode geometry. In either structure, charges (electrons and ions) produced upon ionization of the gas volume of a selected discharge cell, when proper alternating operating voltages are applied between the opposed electrodes, are collected upon the surface of the dielectric at specifically defined locations. These charges constitute an electrical field opposing the electrical field which created them so as to reduce the voltage and terminate the discharge for the remainder of the cycle portion during which the discharge producing polarity remains applied. These collected charges aid an applied voltage of the polarity opposite that which created them in the initiation of a discharge by imposing a total voltage across the gas sufficient to again initiate a discharge and a collection of charges. This repetitive and alternating charge collection and ionization discharge constitutes an electrical memory.

An example of a panel structure containing non-physically isolated or open discharge cells is disclosed in U.S. Pat. No. 3,499,167 issued to Theodore C. Baker et al. Physically isolated cells have been disclosed in the article by D. L. Bitzer and H. G. Slottow entitled "The Plasma Display Panel — A Digitally Addressable Display With Inherent Memory" Proceeding of the Fall Joint Computer Conference, I E E E, San Francisco, Cal., Nov. 1966, pp 541–547 and in U.S. Pat. No. 3,559,190.

One construction of a memory/display panel includes a continuous volume of ionizable gas confined between a pair of dielectric surfaces backed by conductor arrays, typically in parallel lines with the arrays of lines orthogonally related, to define in the region of the projected intersections as viewed along the common perpendicular to each array, a plurality of opposed pairs of charge storage areas on the surfaces of the dielectric bounding or confining the gas. Many variations of the individual conductor form, the array form, their relationship to each other and to the dielectric and gas are available, hence the orthogonally related, parallel line arrays which are discussed herein are merely illustrative.

In the operation of the display/memory device an alternating voltage is applied, typically, by applying a first periodic voltage wave form to one array and applying a cooperating second wave form, frequently identical to and shifted on the time axis with respect to the first wave form, to the opposed array to impose a voltage across the cells formed by the opposed arrays of electrodes which is the algebraic sum of the first and second wave forms. The cells have a voltage at which a discharge is initiated. That voltage can be derived from an externally applied voltage or a combination of wall charge potential and an externally applied voltage. Ordinarily, the entire cell array is excited by an alternating voltage which, by itself, is of insufficient magnitude to ignite gas discharges in any of the elements. When the walls are appropriately charged, as by means of a previous discharge, the voltage applied across the element will be augmented, and a new discharge will be ignited. Electrons and ions again flow to the dielectric walls extinguishing the discharge. However, on the following half cycle, their resultant wall charges again augment the applied external voltage and cause a discharge in the opposite direction. The sequence of electrical discharges is sustained by an alternating voltage signal that, by itself, could not initiate that sequence.

In addition to the sustaining voltage, there are manipulating voltages or addressing voltages imposed on the opposed electrodes of a selected cell or cells to alter the state of those cells selectively. One such voltage, termed a "writing voltage", transfers a cell or discharge site from the quiescent to the discharging state by virtue of a total applied voltage across the cell sufficient to make it probable that on subsequent sustaining voltage half cycles the cell will be in the "on state". A cell in the "on state" can be manipulated by an addressing voltage, termed an "erase voltage", which transfers it to the "off state" by imposing sufficient voltage to draw off the surface or wall charges on the cell walls and cause them to discharge without being collected on the opposite cell walls in an amount such that succeeding sustainer voltage transitions are not augmented sufficiently by wall charges to ignite discharges.

Circuitry for sustaining voltages, and where employed, their pedestal, and for the manipulating voltages for writing and erasing individual cells can be quite extensive. Transformer coupling of manipulating signals to the electrodes of multiple gas discharge display/memory devices has been disclosed in William E. Johnson et al, U.S. Pat. No. 3,618,071 for "Interfacing Circuitry and Method For Multiple-Discharge Gaseous Display and/or Memory Panels" which issued Nov. 2, 1971. The coupling of individual electrodes in large arrays involving substantial numbers of electrodes is cumbersome and expensive. Accordingly, solid-state pulsar circuits capable of feeding through the sustaining voltage were proposed as exemplified in William E. Johnson, U. S. Pat. No. 3,611,296 of Oct. 5, 1971 entitled "Driving Circuitry For Gas Discharge Panel". Multiplexing of the signals to the electrodes in an array has been utilized employing combinations of diode and resistor pulsers to manipulate cell potentials as shown in U.S. Pat. No. 3,684,918, issued Aug. 15, 1972 to Larry J. Schmersal for "Gas Discharge Display/Memory Panels and Selection and Addressing Circuits Therefor".

SUMMARY OF THE INVENTION

The present invention concerns the operation of a multicelled gas discharge display/memory device. An interface and addressing circuit is connected to a pair of opposed electrode arrays to energize a plurality of discharge cells, each cell including proximate electrode portions of at least one electrode in each opposed array with a dielectric charge storage member insulating one of the proximate electrode portions from the gas.

The interface and addressing circuit includes sustainer voltage sources for maintaining a series of discharges in a cell and a pulser-resistor-diode matrix for writing and erasing selected cells. The sustainer voltage sources generate an alternating polarity wave form which is applied to all the cells in the gas discharge device. A cell which is in the "off" state can be transferred to the "on" state by applying a write pulse to the cell during the appropriate portion of the sustainer wave form. A write pulse initiates a sequence of discharges which are maintained by the sustainer voltage wave form. The sequence of discharges may be terminated by applying an erase pulse at the appropriate portion of the sustainer wave form.

In accordance with the present invention, the brightness of cells which are in the "on" state is increased by cyclically superimposing an "enhancement" pulse on the sustainer wave form. An enhancement pulser means generates a suitably narrow pulse having the same polarity as the sustainer wave form. The "enhancement" pulses are superimposed on the sustainer wave form such that they are coincident with the discharge pulses of cells which are in the "on" state. This increase in voltage across a cell results in a larger discharge pulse and consequently a brighter light pulse.

An object of the present invention is to increase the brightness of a multicelled gas discharge display/memory device.

Another object of the present invention is to optimize the dynamic wave forms applied to a multicelled gas discharge display/memory devices.

DESCRIPTION OF THE PREFERRED EMBODIMENT

Figure 1:
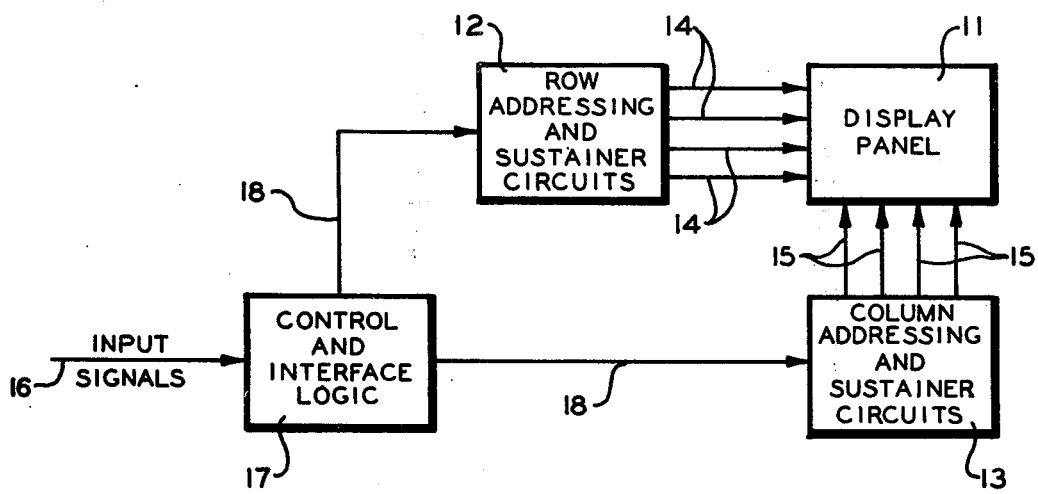
FIG. 1 is a block diagram of a multicelled gas discharge display/memory device and operating system therefor.

There is shown in FIG. 1 a block diagram of a multicelled gas discharge display/memory device and operating system therefor to which the present invention is applicable. The device is represented as a display panel 11 which can be of the type disclosed in U.S. Pat. No. 3,499,167 issued to Theodore C. Baker et al. The panel 11 includes a pair of opposed electrode arrays (not shown) with proximate electrode portions of at least one electrode in each array defining the cells. The addressing and sustainer wave forms are generated by a pair of addressing and sustainer circuits, a row circuit 12 and a column circuit 13, which are connected to the row and column electrode arrays respectively. A plurality of leads 14 are representative of the interconnections between the row circuit 12 and the row electrodes (not shown) of the panel 11 and a plurality of leads 15 are representative of similar interconnections between the circuit 13 and the column electrodes. The information to be displayed by the panel 11 is externally generated and applied as input signals on one or more input lines 16 to a control and interface logic circuit 17. The circuit 17 buffers and decodes the input signals to generate control signals on lines 18 to the circuits 12 and 13.

Figure 2:
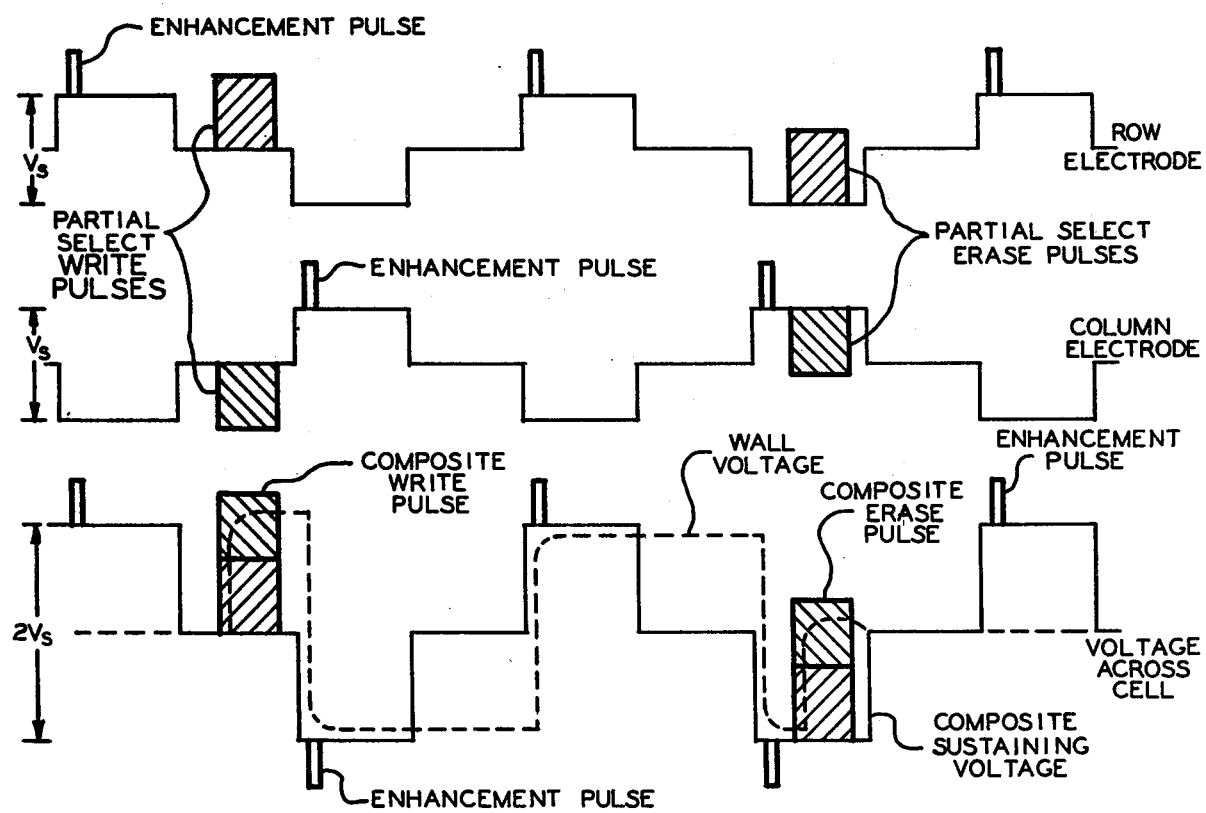
FIG. 2 is a wave form diagram of the sustainer wave form with enhancement pulses according to the present invention.

There is shown in FIG. 2 the addressing and sustainer wave forms associated with the bistable operation of a gas discharge cell according to the present invention. Typically, a periodic sustaining voltage sufficient to operate the panel is applied to the opposing electrode arrays, the wave form being rectangular, square, sinusoidal, trapezoidal, triangular or of any other periodic geometric form or shape. As shown in FIG. 2, one-half of the sustaining voltage is applied to the row electrode array and the other half is applied at 180° phase or opposite polarity to the opposing column electrode array, the two applied sustaining voltages being algebraically added across the cells of the panel. It is also possible to apply all the sustaining voltage to only one electrode array or to apply a non-symmetrical wave form.

The magnitude of the sustaining voltage is insufficient to cause any cells to turn on (i.e. to initiate a stable sequence of discharges), but is sufficient to sustain a discharge sequence once the sequence has been initiated by a "write" pulse applied to the selected site. The magnitude of the "write" pulse must exceed the firing potential of the site and can be applied between the alternate half cycles of the sustaining voltage, superimposed on a half cycle or superimposed on a pedestal as shown in FIG. 2. The utilization of the pedestal with the sustaining voltage wave form allows the use of a smaller magnitude write pulse which can be generated by less expensive electronics.

In the operation of a multiple gas discharge display/memory device which contains opposing electrode arrays, the writing of a particular unit or cell is usually effected by applying a writing voltage to one electrode of the cell and a similar writing voltage to the opposing electrode of the cell. The phase of each writing voltage is such that the two voltages are algebraically added to form a "write" pulse of sufficient magnitude to turn on the cell. The write voltages are known as partial select voltages. If the writing voltages are derived from the same source, each is equal to the other in magnitude and therefore represents one-half of the write pulse. Such write voltages are known as half select voltages. A site may be turned off by applying an appropriate "erase" pulse as shown in FIG. 2 which has the effect of reducing the wall voltage to a level insufficient to reinforce the reversed sustaining voltage to produce a discharge pulse.

Because the conducting electrodes are separated from the discharge by a thin layer of insulating dielectric material, the gas discharges occur as short pulses. As the discharge current flows, the electrons and ions accumulate on the insulating surfaces producing an electric field which opposes the field which caused breakdown. The voltage due to these charges on the walls is called the wall voltage. When the polarity of the applied voltage changes, the wall voltage adds to the applied voltage thus producing another discharge pulse. This process repeats every half cycle producing a sequence of discharges which continues indefinitely.

The sequence of discharge pulses is accompanied by a sequence of light pulses (not shown). The repetition rate of the light pulses is fast enough so that the light appears steady to the human eye. A typical sustaining voltage frequency is in the range 30–50 kHz. The magnitude of the sustaining voltage must be kept within a certain range, the bistable range. If the sustaining voltage is too high, discharge sites will be turned on by the sustaining voltage alone, thus negating the ability to address selected points on the row-column matrix by the application of a write pulse. The memory of the panel is a consequence of the charges stored on the insulating surfaces. For a given display panel, the limits of the bistable range depend on many parameters such as the composition of the fill gas, the pressure, the panel geometry and panel materials.

As previously mentioned, once a discharge sequence has been initiated by a "write" pulse applied to a selected cell, the sustaining voltage will continue to maintain the discharge sequence. It is known in the art that increasing the magnitude of the sustaining voltage also increases the light intensity of selected cells. The increase in brightness can be artibuted to the larger light pulses which are generated as a result of the larger discharge currents. However, the magnitude of the sustaining voltage must not be increased above the upper limit of its bistable range if the panel is to operate properly. Thus, the brightness which can be achieved is limited by the maximum magnitude of the sustaining voltage.

In accordance with the present invention, the brightness of selected cells is increased by generating an "enhancement" pulse which is superimposed on the sustaining voltage wave form coincident with each discharge pulse of the cells in the "on" state. As shown in FIG. 2, an "enhancement" pulse is alternately applied to the row and column electrodes in an aiding direction with the sustaining voltage. The composite sustaining wave form results in a separate "enhancement" pulse coincident with each discharge pulse. The polarity of the enhancement pulse alternates in accordance with the polarity of the sustainer wave form. By increasing the voltage across a selected cell during the time when a discharge occurs, a greater number of charges (electrons and ions) will be produced. This results in a larger discharge pulse and consequently a larger light pulse. The duration of the "enhancement" pulse is suitably narrow so as not to allow sufficient time to allow the excess charges to collect on the dielectric and consequently allow the wall voltage to exceed the sustaining voltage. Thus, the brightness of a cell in the "on" state will increase in accordance with the allowable width - amplitude of the "enhancement" pulse.

In addition to increasing the brightness of the cells in the "on" state the enhancement pulse will also increase the bistable range of operating voltages of the sustainer wave form in most panels. The lower voltage limit, the voltage at which a discharge sequence will not be maintained, will decrease more than the higher voltage limit, the voltage at which a cell turns on by the sustaining voltage alone. Thus, the bistable voltage range will increase. Although an enhancement pulse might make erasing more difficult on some panels, the enhancement pulses could be eliminated during erase cycles.

Figure 3:
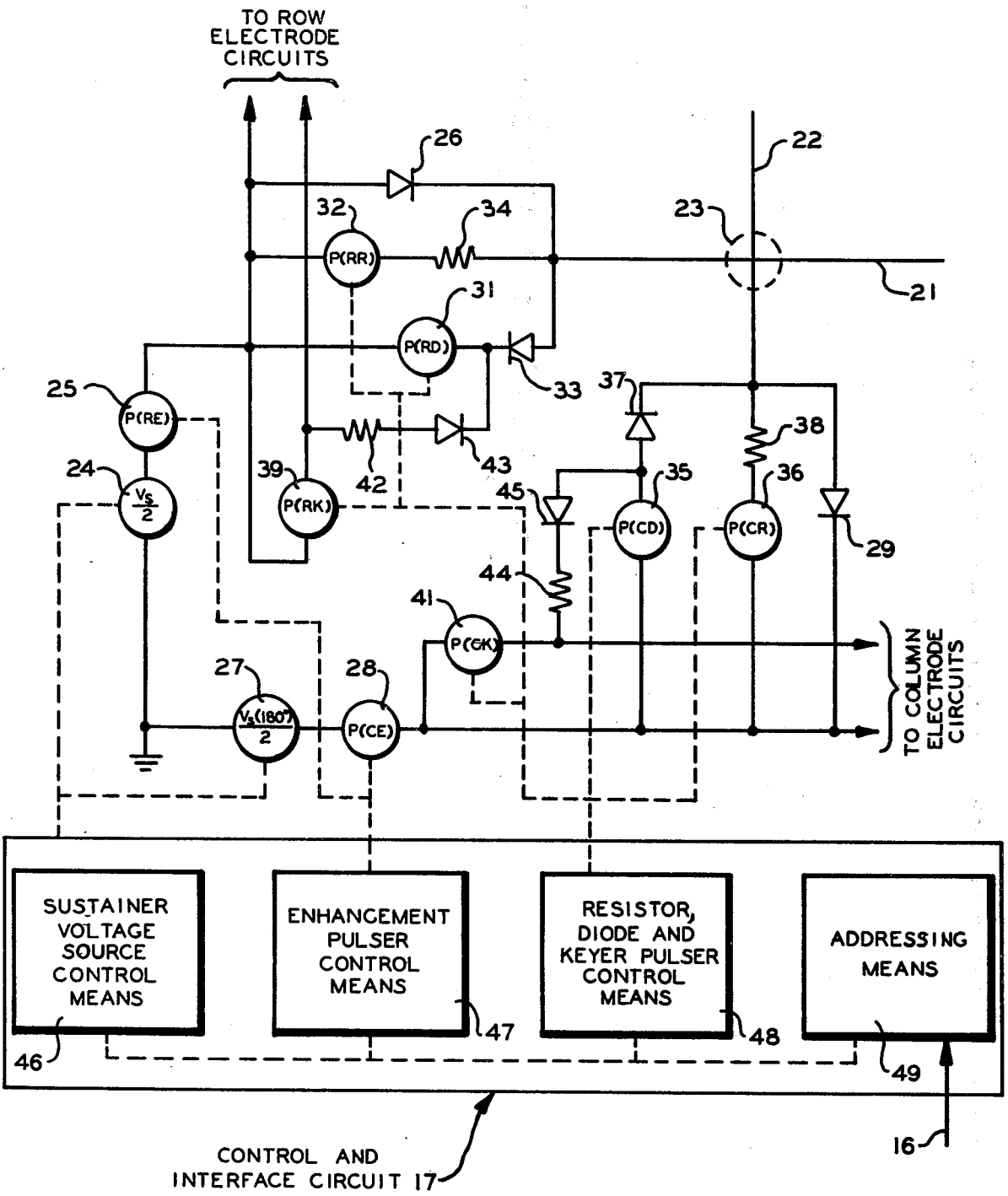
FIG. 3 is a schematic representation of the addressing and sustainer circuit which generates the wave forms of FIG. 2 according to the present invention.

There is shown in FIG. 3 a schematic representation of the addressing and sustainer circuit which is utilized for driving a single row electrode 21 and a single column electrode 22 whose intersection defines a single cell or discharge site. The single cell is represented by a dashed circle 23. The electrodes are connected to a diode-resister matrix for selecting individual column electrodes and individual row electrodes to write and erase selected cells. A pair of sustainer voltage sources are each connected in series with a separate enhancement pulser between the electrode arrays and the circuit ground potential to supply the sustainer voltage to the cell.

A row sustainer voltage source 24 is connected between a row enhancement pulser P(RE) 25 and the circuit ground potential. The enhancement pulser 25 is connected to the row electrode 21 and all other row electrodes (not shown) through a plurality of diodes such as a feed through diode 26 having an anode connected to the pulser 25 and a cathode connected to the electrode 21. A column sustainer voltage source 27 is connected between a column enhancement pulser P(CE) 28 and the circuit ground potential. The enhancement pulser 28 is connected to the column electrode 22 and all other column electrodes (not shown) through a plurality of diodes such as a feed through diode 29 having a cathode connected to the pulser 28 and an anode connected to the electrode 22.

A plurality of pulser voltage generators are utilized to address the individual electrodes. A row diode pulser P (RD) 31 and a row resistor pulser P (RR) 32 are connected in parallel with the diode 26 between the row enhancement pulser 25 and the row electrode 21. A row diode 33 has an anode connected to the electrode 21 and a cathode connected to the pulser 31. A row resistor 34 is connected between the pulser 32 and the electrode 21. The pulser-diode-resistor circuit for the column electrode 22 is similar. A column diode pulser P (CD) 35 and a column resistor pulser P (CR) 36 are connected in parallel with the diode 29 between the column enhancement pulser 28 and the column electrode 22. A column diode 37 has an anode connected to the pulser 35 and a cathode connected to the electrode 22. A column resistor 38 is connected between the pulser 36 and the electrode 22. Since the resistor and diode pulsers are connected in series with the enhancement pulses and the sustainer voltage sources between the electrodes and the circuit ground potential, the pulser voltage wave forms will float on the sustainer voltage wave forms and will be referenced from the composite sustainer wave form as shown in FIG. 2. If the cell 23 is selected for writing or erasing, the pulsers 32 and 36 are turned on to generate a voltage pulse and the pulsers 31 and 35 are turned off to block the voltage pulse from returning through the pulsers 31 and 35. Furthermore, the resistor and diode pulsers may each be connected to more than one electrode through associated resistors and diodes, but each pair of resistor and diode pulsers are connected to only one common electrode. The diode pulsers connected to electrodes which have not been selected but have a pulse voltage applied are turned on to provide a current path back to the resistor pulser.

There is also shown in FIG. 3 a pair of pulsers, a row keyer pulser P (RK) 39 common to all row electrodes and a column keyer pulser P (CK) 41 common to all column electrodes. The row keyer pulser 39 is connected in series with a resistor 42 and a diode 43 in parallel with the row diode pulser 31. The column keyer pulser 41 is connected in series with a resistor 44 and a diode 45 in parallel with the column diode pulser 35. The row keyer pulser 39 is connected through a plurality of resistors and diodes to the row diode pulsers for each of the other row electrodes and the column keyer pulser 41 is connected in a similar manner to all of the other column electrodes. The keyer pulser voltage wave forms will float on the sustainer voltage wave forms and will be referenced from the composite sustainer wave form of FIG. 2.

The sustainer voltage sources 24 and 27 generate voltages which are 180° out of phase so that each source need supply only one-half of the sustainer voltage Vs required to sustain discharges at a selected cell. The voltage sources 24 and 27 continuously generate the Vs/2 and Vs (180°) /2 voltages to the row and column electrodes. These voltages are periodic and can be for example sinusoidal, trapezoidal, square wave (as shown in FIG. 2) or triangular. The sustainer wave forms can also be asymmetric as disclosed in U.S. Pat. No. 3,840,779 issued to Jerry D. Schermerhorn on Oct. 8, 1974. The sustainer voltage is passed through the diode pulsers 31 and 35 such that the diodes 26 and 29 provide a current path for one polarity of the sustainer voltage and the diodes 33 and 37 provide a current path for the other polarity of the sustainer voltage.

The row and column enhancement pulsers 25 and 28 are alternately turned on during the appropriate portions of the sustainer wave form to generate the "enhancement" pulses of FIG. 2. Since the pulsers 25 and 28 are connected in series with the sustainer sources 24 and 27 respectively, the "enhancement" pulses will float on the sustainer wave form. As shown in the composite wave form of FIG. 2, the row enhancement pulser is utilized to generate an "enhancement" pulse of one polarity across the cell, while the column enhancement pulser generates an "enhancement" pulse of the other polarity across the cell.

As disclosed in the previously referenced U.S. Pat. No. 3,727,102, the pulsers 31, 32, 35 and 36 are utilized to generate the write and erase pulses for turning on and off respectively the cell 23. If the sustaining voltage source 24 is generating a positive polarity wave form with respect to the circuit ground potential and the source 27 is generating a ground potential wave form, the charging current for the cell is flowing through the diodes 26 and 29. The pulsers 31 and 32 generate a negative polarity wave form with respect to the circuit ground potential and the pulsers 35 and 36 generate a positve polarity wave form to generate an erase pulse which has a polarity opposite that of the sustaining voltage. If the sources 24 and 27 are generating ground and positive polarity wave forms respectively, then the pulse generated by the pulsers will be a write pulse since it has the same polarity as the sustaining voltage.

The natural capacitance of the discharge cells and the associated circuitry tends to soften the leading edge of the write and erase pulses. This effect is undesirable where a relatively rapid succession of writing and erasing operations must be performed. Therefore, the row keyer pulser 39 and the column keyer pulser 41 were added to the resistor-diode matrix to improve the rise time of the leading edge of the write and erase pulses. They are connected in parallel to all the row electrodes and column electrodes so that only one pair is required. Where the panel includes a relatively large number of electrodes, more than one pair of keyer pulsers may be required with each one connected to a separate group of electrodes. The keyer pulsers are turned on at the same time that the other pulsers are turned on to generate the steeply rising leading edge shown in the write and erase pulses of FIG. 2. The keyer pulsers are then turned off and, when the other pulsers are turned off, the cell rapidly discharges through the diodes to generate the steeply falling trailing edge of the write and erase pulses.

The control and interface logic circuit 17 includes a sustainer voltage source control means 46, an enhancement pulser control means 47, a resistor, diode and keyer pulser control means 48 and an addressing means 49. The sustainer control means 46 enables the sustainer voltage sources 24 and 27 to apply the sustainer voltage to all the cells of the panel. The enhancement pulser control means 47 senses the timing of the sustainer control means such that the enhancement pulsers 25 and 26 are turned on to generate voltage pulses during the appropriate portions of the sustainer wave form. The addressing means 49 receives information on the line 16 from an external source which can be, for example, a computer, a tape reader or a keyboard. The addressing means 49 then determines which cells are to be written or erased and sends control signals to the resistor, diode and keyer pulser control means 48. If the cell 23 is to be turned on, the control means 48 senses the timing of the sustainer control means for generating a write pulse. The control means 48 turns off the diode pulsers 31 and 35 and turns on the resistor pulsers 32 and 36 and the keyer pulsers 39 and 41. Turning off the diode pulsers 31 and 35 prevents the voltage pulses from returning through the pulsers 31 and 35 and forces the voltage pulses to appear at the electrodes 21 and 22. The step of turning off the cell 23 is the same as for writing except that the address pulse is applied during a different portion of the sustainer wave form.

In summary, the present invention is applied to an operating system for a gas discharge display/memory cell defined by proximate electrode portions of a pair of opposed spaced electrodes, an ionizable gas volume between the spaced electrode portions of the cell, a dielectric charge storage member in contact with the gas insulating at least one electrode portion of the cell from the gas, a sustainer voltage source for cyclically imposing a periodic alternating polarity sustainer voltage across the cell and an addressing means for generating address voltage pulses to manipulate the discharge state of the cell between an "on state" and an "off state". The invention comprises a means for cyclically generating an enhancement voltage pulse having the same polarity the sustainer voltage and superimposing the pulses on the sustainer voltage coincident with each discharge of the cell when the cell is in the "on state". The present invention also concerns the method of increasing the brightness of gas discharge cells in the "on state" by applying to the cells a periodic, alternating polarity sustainer voltage having a magnitude and duration sufficient to maintain a discharge in any cell which is in the "on state" and applying to the cells enhancement voltage pulses having the same polarity as the sustainer voltage and coincident with each discharge of the cells.

In accordance with the provision of the patent statutes, the principle and mode of operation of the invention have been explained and illustrated in its preferred embodiment. However, it must be understood that the invention may be practiced otherwise than as specifically illustrated and described without departing from its spirit or scope.

What is claimed is:

1. In an operating system for the gas discharge display/memory cell defined by proximate electrode portions of a pair of opposed spaced electrodes; an ionizable gas volume between the spaced electrode portions of the cell; a dielectric charge storage member in contact with the gas insulating at least one electrode portion of the cell from the gas; a sustainer voltage source for cyclically imposing a periodic alternating polarity sustainer voltage across the cell; and an addressing means for generating address voltage pulses to manipulate the discharge state of the cell between an "on state" and an "off state", the improvement comprising:

means for cyclically generating an enhancement voltage pulse having the same polarity as said sustainer voltage and being generated coincident with each discharge of said cell when said cell is in the "on state".

2. A system according to claim 1 wherein said enhancement voltage pulse generating means superimposes said enhancement voltage pulses on said sustainer voltage.

3. A system according to claim 2 wherein said enhancement voltage pulse generating means is connected in series between said sustainer voltage source and said pair of spaced electrodes.

4. A method of increasing the brightness of individual cells of a gas discharge display/memory device which cells are in the "on state", the method comprising:

applying to said cells a periodic, alternating polarity sustainer voltage having a magnitude and duration sufficient to maintain a discharge in any cell which is in the "on state"; and applying to said cells enhancement voltage pulses having the same polarity as said alternating polarity sustainer voltage and being applied coincident with each discharge of said cells when said cells are in the "on state".

5. A method according to claim 4 wherein the step of applying said enhancement voltage pulses is accomplished by superimposing said pulses on said sustainer voltage.

6. A method according to claim 4 wherein said enhancement voltage pulses are of a width insufficient to turn the ones of said cells in the "off state" to the "on state".

* * * * *